(12) United States Patent
Merkel et al.

(10) Patent No.: US 8,493,008 B2
(45) Date of Patent: Jul. 23, 2013

(54) HVAC ADJUSTMENT MODULE

(75) Inventors: William F. Merkel, Cleveland, OH (US); William M. Jones, Hunting Valley, OH (US); Robert G. Klimo, North Royalton, OH (US)

(73) Assignee: Dynamotors, Inc., Cleveland, OH (US)

( * ) Notice: Subject to any disclaimer, the term of this patent is extended or adjusted under 35 U.S.C. 154(b) by 0 days.

(21) Appl. No.: 13/352,515

(22) Filed: Jan. 18, 2012

(65) Prior Publication Data

US 2012/0212166 A1 Aug. 23, 2012

Related U.S. Application Data

(60) Provisional application No. 61/433,701, filed on Jan. 18, 2011.

(51) Int. Cl.
*H02P 6/00* (2006.01)
(52) U.S. Cl.
USPC ............ 318/400.08; 318/400.12; 318/400.17; 318/400.18; 318/798; 236/51; 236/67; 236/74 R
(58) Field of Classification Search
USPC ............ 318/400.17, 400.08, 400.12, 400.18, 318/798; 236/51, 67, 74 R
See application file for complete search history.

(56) References Cited

U.S. PATENT DOCUMENTS

| 5,410,230 | A | * | 4/1995 | Bessler et al. | 318/471 |
|---|---|---|---|---|---|
| 5,592,059 | A | * | 1/1997 | Archer | 318/400.08 |
| 5,634,346 | A | * | 6/1997 | Ramakrishnan et al. | 62/89 |
| 6,155,341 | A | * | 12/2000 | Thompson et al. | 165/244 |
| 2005/0278071 | A1 | | 12/2005 | Durham, III | |
| 2007/0268726 | A1 | * | 11/2007 | Kojori et al. | 363/65 |
| 2010/0070085 | A1 | * | 3/2010 | Harrod et al. | 700/276 |
| 2010/0070089 | A1 | * | 3/2010 | Harrod et al. | 700/277 |

* cited by examiner

*Primary Examiner* — Erick Glass
(74) *Attorney, Agent, or Firm* — Fay Sharpe LLP

(57) ABSTRACT

A heating, ventilation and air conditioning (HVAC) system is provided. The system includes an integrated motor including a plurality of operating speeds and an input for selecting one of the plurality of operating speeds. The system further includes a system controller and an adjustment module. The adjustment module includes a plurality of operating modes each associated with one of the plurality of operating speeds and the ability to manually vary associations between the plurality of operating modes and the plurality of operating speeds. The adjustment module selects one of the plurality of operating modes on the basis of control commands received from the system controller and setting programmed or manually entered into and stored in the adjustment module and controls the integrated motor according to the operating speed associated with the selected operating mode.

20 Claims, 6 Drawing Sheets

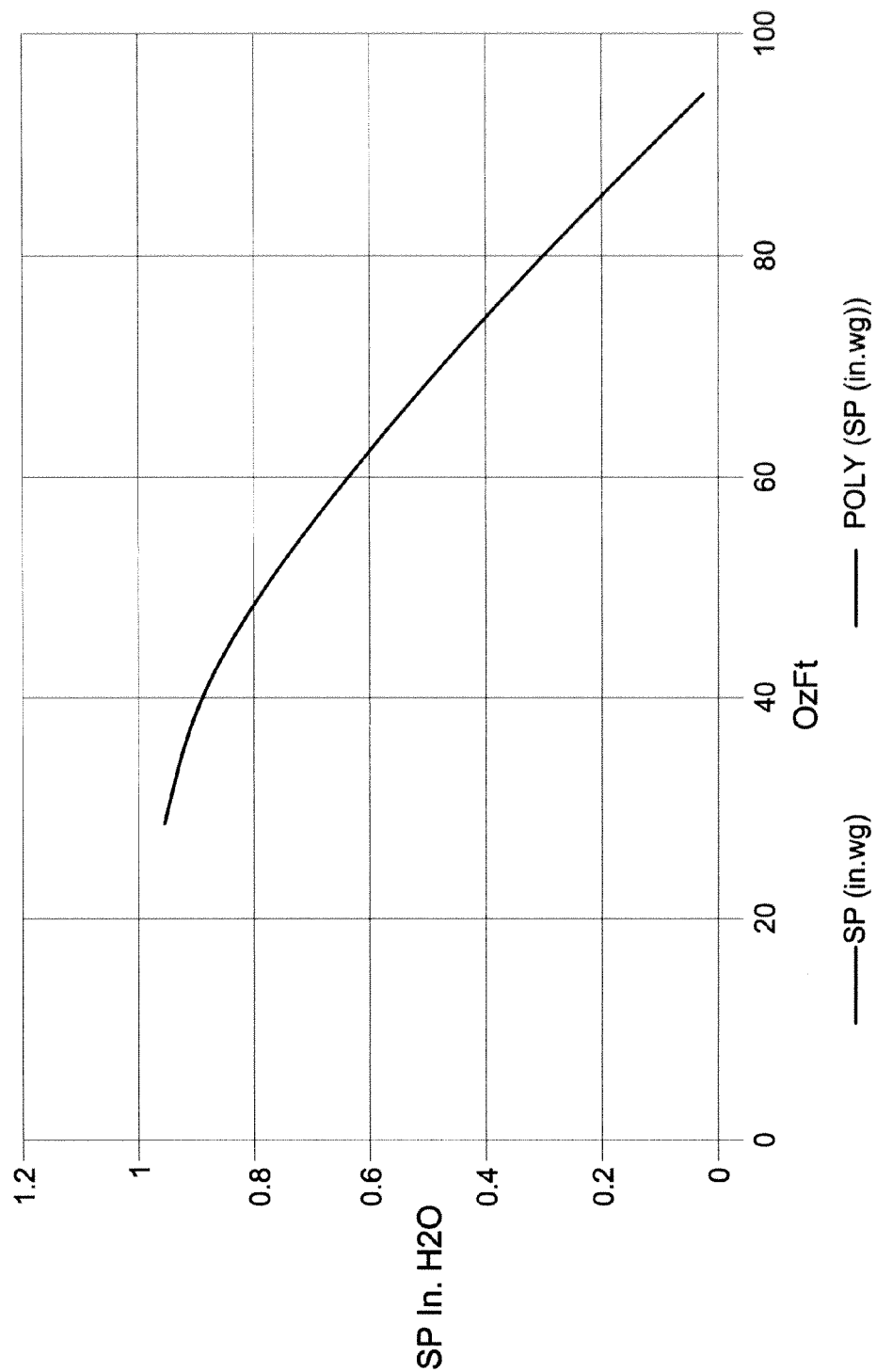

HVAC ADJUSTMENT MODULE

This application claims the benefit of U.S. Provisional Application No. 61/433,701, filed Jan. 18, 2011, which is incorporated herein by reference in its entirety.

BACKGROUND

The present exemplary embodiments relate generally to heating and cooling. They find particular application in conjunction with heating, ventilation, and air conditioning (HVAC) systems, and will be described with particular reference thereto. However, it is to be appreciated that the present exemplary embodiments are also amenable to other like applications.

By way of background, many residential and small commercial forced air HVAC systems employ Permanent Split Capacitor (PSC) motors and/or an Electronically Commutated Motors (ECMs) to drive blowers. These motors generally include selectable speed taps for indoor speed control. Speed is determined by characteristics of the motor and system configuration parameters, such as duct size and installation, dampers and diffusers, HVAC system size, and the like.

Generally, operating modes for HVAC systems, such as heating, cooling, and constant fan operation, require different operating speeds of the motor. Namely, each operating mode generally has an optimum airflow and/or static pressure based on the physics of the heat exchange mechanism. In a heating mode it is based on a heat exchanger, in cooling mode it is based on a cooling coil, and in a fan mode is the slowest speed that achieves good mixing and/or filtering of air and saves energy, since the fan mode serves to even temperatures in a home and push air through filters. Therefore, different taps and speeds are generally used for different operating modes.

The speeds used for different operating modes are normally selected during commissioning of the system by the installer. The installer generally accomplishes this by making electrical connections to a control system, such that the desired tap and speed are energized by the control system for the appropriate mode of operation (e.g., heating). One problem with this arrangement, however, is that once a tap and speed are selected, the installer has no control of the speed.

Limiting the installer's flexibility to set speed reduces or eliminates their ability to solve common system problems that can be corrected through precision airflow adjustment. For example, in the case of heating, the temperature rise of air leaving a heat pump may be less than that leaving a furnace, thereby reducing comfort. This may be addressable by slowing the air down and making it warmer coming out of the vents. As another example, in the case of cooling, an improperly configured HVAC system may lead to low or high humidity levels, thereby reducing comfort.

The flow of air leaving an air conditioner may control humidity levels, where slowing airflow may increase dehumidification. Therefore, if one's house is close to water, the surrounding environment is likely to include high humidity, whereby more dehumidification is desirable. Similarly, if one lives in a dry area, such as Death Valley, the surrounding environment is likely to include low humidity, whereby less dehumidification is preferably.

Fixed speed PSC motors also might cause ductwork and air noise due to the rapid startup of the motor. The rapid start up of the motor will also cause uncomfortable drafts that are lessened using the invention which provides gradual acceleration of the ECM blower motor to reduce the sudden surge of air in the ductwork.

The exemplary embodiment contemplates new and improved systems and/or methods for remedying this and other problems.

BRIEF DESCRIPTION

Various details of the exemplary embodiment are hereinafter summarized to provide a basic understanding. This summary is not an extensive overview of the disclosure and is intended neither to identify certain elements of the disclosure, nor to delineate the scope thereof. Rather, the primary purpose of the summary is to present certain concepts of the disclosure in a simplified form prior to the more detailed description that is presented hereinafter.

The exemplary embodiment is primarily designed to be used as an ECM motor replacement of a PSC motor or an upgrade of a PSC motor to an ECM motor in existing HVAC systems and not for use in new factory assembled HVAC systems.

The exemplary embodiment is designed to provide a compatible replacement motor and control for a wide variety of installed HVAC systems and also incorporates the existing thermostat control and furnace safety circuits.

The exemplary embodiment also allows the installer to tune the airflow of an HVAC system to correct airflow problems that cannot by corrected with an HVAC system using a fixed speed PSC blower motor.

According to one aspect of the exemplary embodiment, a variable speed blower motor unit controlled by a heating, ventilation and air conditioning (HVAC) system controller. The variable speed blower motor unit may include an integrated motor including a plurality of operating speed ranges and an input for selecting one of the plurality of operating speed ranges. The variable speed blower motor unit may further include an adjustment module coupled to the integrated motor and the HVAC system controller. The adjustment module may include a plurality of operating modes each associated with one of the plurality of operating speeds. The adjustment module selects one of the plurality of operating modes on the basis of control commands received from the HVAC system controller and controls the integrated motor according to the operating speed associated with the selected operating mode. Further, the adjustment module includes the ability to manually vary associations between the plurality of operating modes and the plurality of operating speeds.

According to another aspect of the exemplary embodiment, a heating, ventilation and air conditioning (HVAC) system is provided. The system includes an integrated motor including a plurality of operating speeds and an input for selecting one of the plurality of operating speed ranges. The system further includes a system controller and an adjustment module. The adjustment module includes a plurality of operating modes each associated with one of the plurality of operating speeds and the ability to manually vary associations between the plurality of operating modes and the plurality of operating speeds. The adjustment module selects one of the plurality of operating modes on the basis of control commands received from the system controller and controls the integrated motor according to the operating speed associated with the selected operating mode.

According to another aspect of the exemplary embodiment, a method for computing and reporting cubic feet per minute (CFM) of airflow of a motor operating at an operating speed and operating torque is provided. The method may include: modeling CFM of the motor as a function of motor torque to create a CFM model; calculating a ratio of the operating speed to a base speed of the motor; calculating a base torque of the motor at the base speed from the ratio and the operating torque; calculating a base CFM of the motor from the base torque and the CFM model; and/or calculating an operating CFM of the motor at the operating speed using the base CFM and the ratio.

According to another aspect of the exemplary embodiment, a variable speed blower motor unit controlled by a heating, ventilation and air conditioning (HVAC) system controller is provided. The variable speed blower generally includes: an integrated motor including a plurality of operating speeds or torques and an input for selecting one of the plurality of operating speeds or torques; and, an adjustment module coupled to the integrated motor and the HVAC system controller, wherein the adjustment module includes a plurality of operating modes each associated with one of the plurality of operating speeds or torques. Optionally, the adjustment module typically selects one of the plurality of operating modes on the basis of control commands received from the HVAC system controller and controls the integrated motor according to the operating speed associated with the selected operating mode, and/or the adjustment module may include the ability to manually vary associations between the plurality of operating modes and the plurality of operating speeds or torques. Further, the adjustment module may display operating CFM of the integrated motor as determined using a method such as the one in the preceding paragraph.

According to another aspect of the exemplary embodiment, a method for computing and reporting static pressure (SP) of a motor operating at an operating speed and operating torque is provided. The method may include: modeling SP of the motor as a function of motor torque to create a SP model; calculating a ratio of the operating speed to a base speed of the motor; calculating a base torque of the motor at the base speed from the ratio and the operating torque; calculating a base SP of the motor from the base torque and the SP model; and/or, calculating an operating SP of the motor at the operating speed using the base SP and the ratio.

According to yet another aspect of the exemplary embodiment, a variable speed blower motor unit controlled by a heating, ventilation and air conditioning (HVAC) system controller is provided. The variable speed blower may include, for example: an integrated motor including a plurality of operating speeds or torques and an input for selecting one of the plurality of operating speeds or torques; and/or an adjustment module coupled to the integrated motor and the HVAC system controller, wherein said adjustment module includes a plurality of operating modes each associated with one of the plurality of operating speeds or torques. Optionally, the adjustment module may selects one of the plurality of operating modes on the basis of control commands received from the HVAC system controller and controls the integrated motor according to the operating speed associated with the selected operating mode, and/or the adjustment module may include the ability to manually vary associations between the plurality of operating modes and the plurality of operating speeds or torques. Further, the adjustment module may display operating SP of the integrated motor as determined using, for example, the method described in the preceding paragraph.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure will be set forth in the following detailed description of the disclosure when considered in conjunction with the drawings, in which.

DETAILED DESCRIPTION

Figure 1:
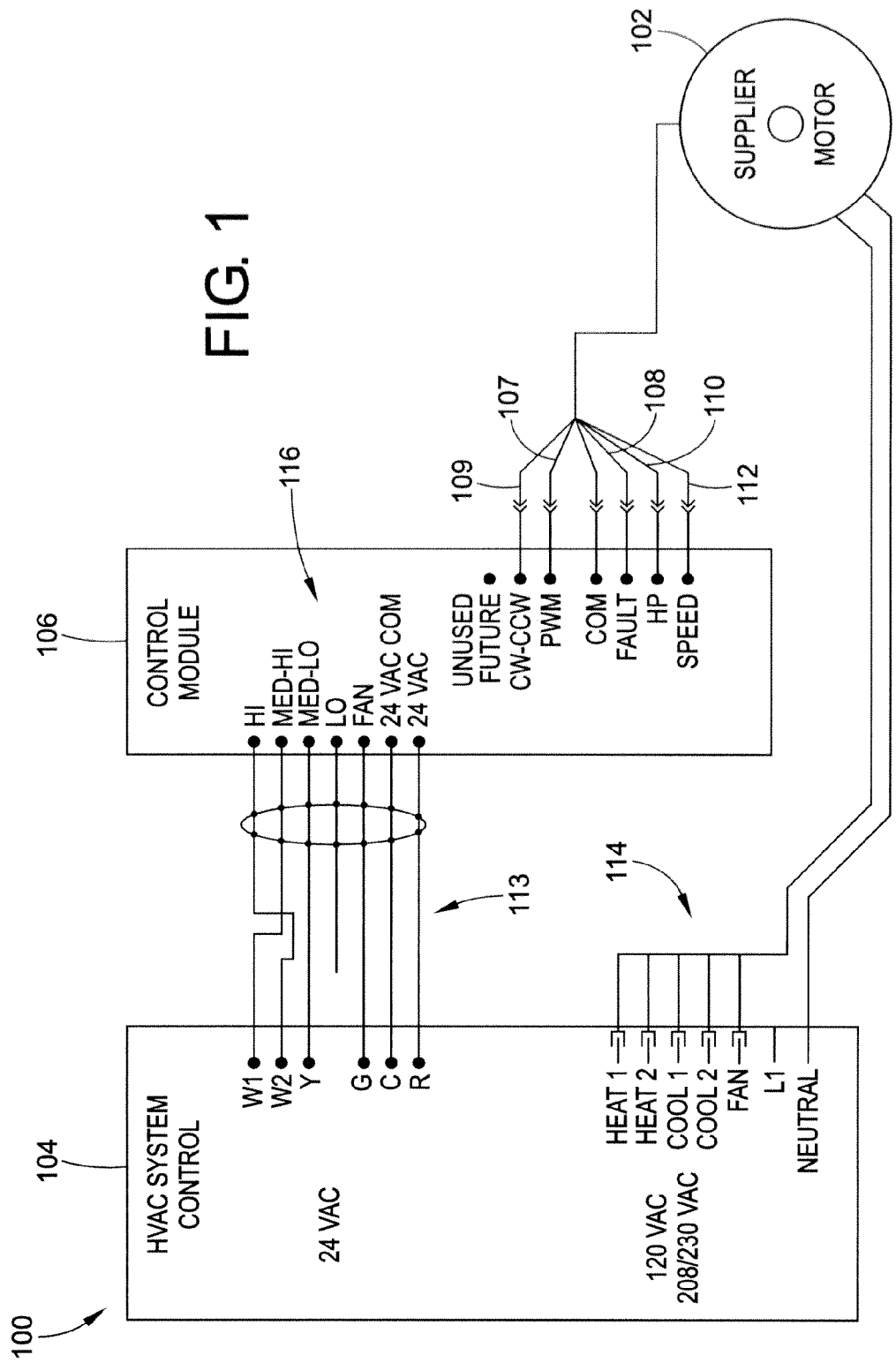
FIG. 1 is a block diagram of an HVAC system according to aspects of the exemplary embodiment.

One or more embodiments or implementations are hereinafter described in conjunction with the drawings, where like reference numerals are used to refer to like elements throughout, and where the various features are not necessarily drawn to scale.

With reference to FIG. 1, a block diagram of an HVAC system 100 according to aspects of the exemplary embodiment is provided. The HVAC system 100 suitably belongs to one or more of the following groups of HVAC systems: residential split and package systems; natural gas, propane, and oil heat furnace systems; dual fuel systems; hot water coil and geothermal air handler systems; and the like.

As will be seen, the HVAC system 100 provides for manual adjustment of blower motor speed and/or torque advantageously allowing higher precision airflow selection, thereby giving the installer or maintenance technician the ability to compensate for system performance problems. For example, as noted above, the installer or maintenance technician may compensate for humidity problems.

The system 100 may include one or more of an integrated motor 102, a system controller 104, an adjustment module 106, and the like. In certain embodiments, the adjustment module 106 may be combined with the integrated motor 102. Alternatively, or in addition, in certain embodiments, the system controller 104 and the adjustment module 106 may be one and the same.

The integrated motor 102 drives a blower operatively connected thereto to move air through a ventilation system of the HVAC system 100. In certain embodiments, the blower may be a direct-drive centrifugal blower. The integrated motor 102 may include one or more of a variable speed motor, such as a PSC and PSC speed controller or ECM motor, a motor driver, and the like. Further, the integrated motor 102 need not have a braking function, whereby the integrated motor 102 may stop via a motor coast down.

The integrated motor 102 is suitably receptive to speed commands and/or torque commands. Speed commands may adjust the operating speed of the integrated motor 102, and torque commands may adjust the operating torque of the integrated motor 102. Further, speed commands and/or torque commands may be embodied by control signal 107, such as a pulse width modulated signal, an analog signal, such as 4-20 mA or 0-10V, serial communications, a CDMA cell phone call, 802.11 wireless Ethernet protocol, GPIB, MODBUS, and the like. In certain embodiments, the integrated motor 102 may further be receptive to a direction command.

Direction commands may adjust the direction of the integrated motor 102 (i.e., clockwise or counter-clockwise) and/or may be embodied by direction signal 109, such as a binary signal, an analog signal, a wireless signal, and the like.

Beyond commands, the integrated motor 102 suitably receives power from the system controller 104. However, in other embodiments, the integrated motor 102 may receive power from another source, such as the adjustment module 106, the HVAC system power source, an external power source, and the like.

The integrated motor 102 suitably outputs one or more of a fault signal 108, a motor ready signal 110, a speed signal 112, a torque signal (not shown), and the like. The fault signal 108 suitably indicates a fault with the integrated motor 102 and may be embodied by a binary signal, an analog signal, a wireless signal, or the like. The motor ready signal 110 suitably indicates the horse power of the integrated motor 102 and/or may be embodied by a constant square wave with a duty cycle proportional to the horse power rating of the integrated motor 102, a digital signal, an analog signal, a wireless signal, or the like. The speed signal 112 suitably indicates the speed of the integrated motor 102 (e.g., revolutions per minute (RPM)) and/or may be embodied by a constant square wave with a frequency proportional to the speed of the integrated motor 102, a digital signal, an analog signal, a wireless signal, or the like. The torque signal suitably indicates the torque of the integrated motor 102 and/or may be embodied by a constant square wave with a frequency proportional to the torque of the integrated motor 102, a digital signal, an analog signal, a wireless signal, or the like.

The system controller 104 controls the HVAC system 100 and provides the adjustment module 106 with control commands. The control commands suitably instruct the adjustment module 106 as to the operating mode of the HVAC system 100, such as heating, and use one or more signals 113. To set the operating mode of the HVAC system 100, the system controller 104 suitably includes one or more user input devices allowing selection of the operating mode. The user input devices may include one or more of a button, a switch, a toggle, a slider, and the like.

Additionally or alternatively, a thermostat of the system controller 104 may set the operating mode of the HVAC system 100. For example, in certain embodiments, the signals 113 include one or more signals generated by the thermostat of the system controller 104, such as one or more of W, Y, G, W1, W2, Y1, Y2, and the like. Y corresponds to cooling, Y1 corresponds to a first cooling stage, Y2 corresponds to a second cooling state, W1 corresponds to a first heating stage, and W2 corresponds to a second heating stage.

Additionally or alternatively, the system controller 104 may include one or more sensors and/or a processor implementing a state machine or program to set the operating mode of the HVAC system 100. In such embodiments, the operating mode may be set on the basis of the sensors, the state machine, or a combination of the two. For example, the HVAC system 100 may enter a heating operating mode if a sensed temperature falls below a threshold.

In certain embodiments, the system controller 104 may include one or more tap connectors 114, such as five tap connectors. The tap connectors 114 are suitably provisioned to connect to taps of a motor, such as a Permanent Split Capacitor (PSC) motor and/or an Electronically Commutated Motor (ECM), where each tap connector may activate a different motor speed. Further, the tap connectors 114 are suitably mapped to operating modes (e.g., heating, cooling, etc.) of the HVAC system 100 by the system controller 104, whereby the tap connectors 14 are generally activated on the basis of operating mode.

In embodiments where the system controller 104 includes the tap connectors 114, the tap connectors 114 are suitably not used to control the speed of the integrated motor 102, as is common in typical HVAC systems. Rather, the tap connectors 114 are employed to power the integrated motor 102. Namely, at least one of the tap connectors will generally be activated whenever the HVAC system 100 is in an operating mode requiring the blower. Therefore, ORing the tap connectors 114 together and using the output thereof can be used to power the integrated motor 102. An activated tap connector generally provides 120V or 240V, up to 15 A. Additionally or alternatively, the tap connectors 114 are employed to provide control commands to the adjustment module 106 via the signals 113. Alternatively, the motor can receive power directly from the main power source and the ORed taps can be used to signal the adjustment module that the system controller requires that the motor be energized.

The adjustment module 106 controls the integrated motor 102 on the basis of control commands. The control commands are suitably received from the system controller 104 and/or the system thermostat and include the operating mode of the HVAC system 100, such as heating. Further, the control commands may be embodied by one or more signals 113 and alternatively 114, such as analog signals, digital signals, wireless signals, and other like signals. When a control command is received, the adjustment module 106 suitably instructs the integrated motor 102 to run at an associated speed, torque, airflow, or static pressure.

In certain embodiments, the control commands may be received via one or more command inputs 116, each corresponding to a different speed, torque, airflow, or static pressure of the integrated motor 102 (collectively referred to as the "operating settings"). Preferably, but not necessarily, five commands inputs are employed. When one of the command inputs is activated, the adjustment module 106 suitably instructs the integrated motor 102 to run at the associated speed, torque, airflow, or a static pressure mode. Activation may be accomplished by providing 24V, but other means are appropriate. Suitably, if more than one command input is activated, the command input with the greatest associated speed, torque, airflow or static pressure may be chosen. However, it is contemplated that if more than one command input is activated, the integrated motor 102 may not run, thereby simulating a failure of a PSC motor.

Advantageously, employing the command inputs 116, may allow an installation and/or maintenance technician to map operating modes to varying speeds, torques, airflows, or static pressures using signals from a thermostat. For example, the installation and/or maintenance technician may associate a signal from a thermostat of the system controller 104 that activates upon the need for cooling with one of the command inputs 116 associated with the appropriate speed for cooling. Further, employing the command inputs 116 allows the installation and/or maintenance technician to easily retrofit an existing HVAC system.

To control the integrated motor 102, the adjustment module 106 translates the control commands to speed commands or torque commands and then provides the speed commands or torque commands to the integrated motor 102. In instances where a control command is associated with an airflow or static pressure, the adjustment module 106 translates the airflow or static pressure to a speed or torque, which is then provided to the integrated motor 102 as a speed command or torque command. Whether speed commands or torque commands are employed is dependent upon whether the adjustment module 106 is in a torque mode, a speed mode, an airflow mode, or a static pressure mode. Suitably, but not necessarily, torque commands are used when in an airflow mode or static pressure mode.

The speed commands suitably range from the minimum rated motor speed to the maximum rated motor speed. For example, for a ½ HP, the motor maximum speed may be 1200 revolutions per minute (RPM), and for a ¾ HP motor, the maximum speed may be 1400 RPM. Similar to the speed commands, the torque commands suitably range from the minimum rated motor torque to the maximum rated motor torque. For a ½ HP motor, the maximum torque may be 42 oz-ft and the minimum torque may be 1 oz-ft.

In certain embodiments, the adjustment module 106 may delay providing speed commands or torque commands to the integrated motor 102 until the integrated motor has started. This determination may be made using the motor ready signal 110 from the integrated motor, since this signal 110 is only active when the integrated motor 102 has power. Other means of determining when the integrated motor 102 has started are, however, equally amenable.

To translate control commands to speed commands and/or torque commands, the adjustment module 106 suitably turns to a lookup table. Namely, when a control command specifying the state of the HVAC system 100 is received, the adjustment module 106 suitably looks for the corresponding state in the lookup table to determine the appropriate operating speed, operating torque, operating flow, or operating pressure of the integrated motor 102 and/or the direction of the integrated motor 102. Additionally, where the looked up value is an operating flow or operating pressure, the adjustment module 106 suitably translates the operating flow or operating pressure to an operating speed or operating torque. For details pertaining to this translation, attention is directed to the following discussion of FIGS. 5-7. The lookup table is suitably stored on a local memory of the adjustment module 106.

Additionally or alternatively, to translate control commands to speed commands and/or torque commands, an operating speed and/or an operating torque may be determined using data from one or more sensors, such as temperature sensors, pressure sensors, flow sensors, and the like. For example, an operating speed and/or an operating torque may be based on temperature, output temperature, temperature rise or drop, and the like. In such embodiments a PID controller may be employed to actively adjust the operating speed and/or operating torque.

To provide the speed commands and/or torque commands to the integrated motor 102, speed commands and/or torque commands are suitably embodied by a pulse width modulated (PWM) signal. However, other means of providing the speed commands are equally amenable. For example, the speed commands and/or the torque commands may be provided by way of an analog signal, such as 4-20 mA or 0-10V, serial communications, a CDMA cell phone call, 802.11 wireless Ethernet protocol, GPIB, MODBUS, and the like.

In embodiments employing a PWM signal, the relationship between motor speed (specified in revolutions per minute (RPM)) and PWM duty cycle may, but not necessarily, be defined as RPM=(1250×duty cycle)+275. Further, the PWM signal may include one or more of a frequency of 80 Hz, a duty cycle ranging from 6% to 100%, a minimum speed of 350 RPM, 24 V, and the like. Alternatively, the relationship between motor torque (specified in ounce-feet (Oz-Ft)) and PWM duty cycle may, but not necessarily, be defined as Oz-Ft=PWM duty cycle %−10%. Further, the PWM signal may include one or more of a frequency of 80 Hz, a duty cycle ranging from 6% to 100%, a minimum torque of 5 Oz-Ft, 24 V, and the like.

Beyond control commands, the adjustment module 106 suitably receives power from the system controller 104. However, in other embodiments, the adjustment module 106 may receive power from another source. For example, the adjustment module 106 may receive power directly from a utility grid. In certain embodiments, the power may include 24V and one of 50 Hz and 60 Hz power.

The adjustment module 106 may further receive one or more of the speed signal 112, the motor ready signal 110, the fault signal 108, and the like from the integrated motor 102. These signals 108, 110, 112 may be digital, analog, or a combination of the two. Further, these signals 108, 110, 112 may be embodied by binary signals, analog signals, digital signals, wireless signals, and the like.

In embodiments in which the speed signal 112 is received, the adjustment module 106 may compare the speed of the integrated motor 102, as specified by the speed signal 112, against the speed provided to the integrated motor 102 via speed commands. If there is a substantial variance, the adjustment module 106 may perform one or more actions, such as disabling the integrated motor 102, increasing the speed sent to the integrated motor 102, generating an audio and/or visual indication, and the like. Additionally, or alternatively, the adjustment module 106 may display the speed of the integrated motor 102 using the speed signal 112 on a display of the adjustment module 106. The display may include one or more of an LCD, a CRT monitor, one or more LEDs, a projector, and the like. Further, the adjustment module 106 suitably updates the display of the operating speed of the integrated motor 102 no less than 1 time per second.

In embodiments in which the torque signal is received, the adjustment module 106 may compare the torque of the integrated motor 102, as specified by the torque signal, against the torque provided to the integrated motor 102 via torque commands. If there is a substantial variance, the adjustment module 106 may perform one or more actions, such as disabling the integrated motor 102, increasing or decreasing the torque command sent to the integrated motor 102, generating an audio and/or visual indication, and the like. Additionally, or alternatively, the adjustment module 106 may display the torque of the integrated motor 102 using the torque signal on a display of the adjustment module 106. The display may include one or more of an LCD, a CRT monitor, one or more LEDs, a projector, and the like. Further, the adjustment module 106 suitably updates the display of the operating torque of the integrated motor 102 no less than 1 time per second.

In embodiments in which the fault signal 108 and/or the motor ready signal 110 are received, the adjustment module 106 may display the fault status of the integrated motor 102 and/or whether the integrated motor 102 is stopped. As noted above, the motor ready signal 110 is only active when the integrated motor 102 is active. The fault signal 108 and/or the motor ready signal 110 may be displayed on the display discussed for the speed signal 112 and/or the torque signal. However, the fault signal 108 and/or the motor ready signal 110 are preferably displayed using one or more light sources, such as LEDs.

In certain embodiments, the adjustment module 106 may include the ability to adjust the operating direction of the integrated motor 102. To adjust the operating direction of the integrated motor, the adjustment module 106 suitably includes one or more user input devices, such as a switch toggling between clockwise and counter clockwise. Adjusting the direction of the motor rotation to operate in the correct direction is required for proper operation of the blower. These user input devices may control direction commands provided to the integrated motor via the direction signal 109.

Additionally or alternatively, in certain embodiments, the adjustment module 106 may include the ability to adjust whether speed commands or torque commands are provided to the integrated motor 102. To adjust whether speed commands or torque commands are provided to the integrated motor 102, the adjustment module 106 suitably includes one or more user input devices, such as a switch toggling between speed mode and torque mode. Notably, however, such a selection is not necessary. For example, in certain embodiments, the adjustment module may allow a hybrid of speed commands and torque commands, whereby there is no defined speed mode and torque mode to toggle between.

Additionally or alternatively, in certain embodiments, the adjustment module 106 may include the ability to adjust one or more of operating speeds, operating torques, operating pressure, operating airflow, and the like of the lookup table (i.e., the operating settings). To adjust the operating settings, the adjustment module 106 suitably includes one or more user input devices, such as buttons, switches, and the like. Additionally, or alternatively, in certain embodiments, the HVAC system 100 may need to enter an operating mode to adjust the associated operating setting.

The user input devices suitably allow the installation and/or maintenance technician to adjust factory default operating settings up to a predetermined number (e.g., 150 RPM when speed is involved), up or down from default values to tune the operating setting for the specific installation/application. The predetermined number is suitably selected to keep the context of LO to HI still valid since installation and/or maintenance technicians will expect each to cover different ranges. Alternatively, the adjustment module 106 may include the ability to adjust the operating direction of the integrated motor 102 and/or operating torques of the lookup table. In certain embodiments, the installation and/or maintenance technician may adjust factory torque defaults up to predetermined number of Oz-Ft, such as 15 Oz-Ft, up or down from default values to tune the speed for the specific installation/application. The predetermined number is suitably selected to keep the speed context of LO to HI still valid since installation and/or maintenance technicians will expect each to cover different ranges.

To illustrate, the user input devices may include a "Program" button, an "Up" button, and a "Down" button. In such embodiments, an installation and/or maintenance technician may select the "Program" button of the adjustment module 106 to enter an edit mode. Once in the edit mode, the installation and/or maintenance technician may then select the "Up" and/or the "Down" buttons to increase and/or decrease the operating setting in predetermined increments, such as increments of 10 RPM. When the adjustments are complete, the installation and/or maintenance technician may then press the "Program" button again to exit the edit mode.

Additionally or alternatively, in certain embodiments, the adjustment module 106 may include the ability to reset any field modified settings to factory defaults. Namely, the adjustment module 106 may include a user input device, such as a button, allowing one to reset the operating settings to factory defaults. As should be appreciated, this is useful for situations in which an installation and/or maintenance technician wishes to start over in their efforts to configure the HVAC system 100.

Additionally, or alternatively, in certain embodiments, the adjustment module 106 may include a protection mechanism to prevent the HVAC homeowner or user from changing the operating settings. For example, the adjustment module 106 may include one or more of a protective cover, a pass code, a key, and the like.

Additionally, or alternatively, in certain embodiments, the adjustment module 106 may include the ability to set an operating setting (e.g., speed or torque) over a predetermined period of time. In other words, the adjustment module 106 may include the ability to adjust the rate of change the integrated motor 102 will apply when changing from one speed or torque to another. For example, the adjustment module 106 may gradually change from a first motor speed or torque to a second motor speed or torque over a period of time, such as 30 seconds. As another example, the adjustment module 106 may gradually change from an off position to a cooling speed or torque, such as 1000 RPM or 30 oz-ft, over a period of 30 seconds. In certain embodiments, the rate employed may be 25 RPM per second.

Additionally, or alternatively, in certain embodiments, the adjustment module 106 may include a switch for enabling "constant blower" operation. This switch maintains the blower in a constant speed, torque, airflow or static pressure.

Figure 2:
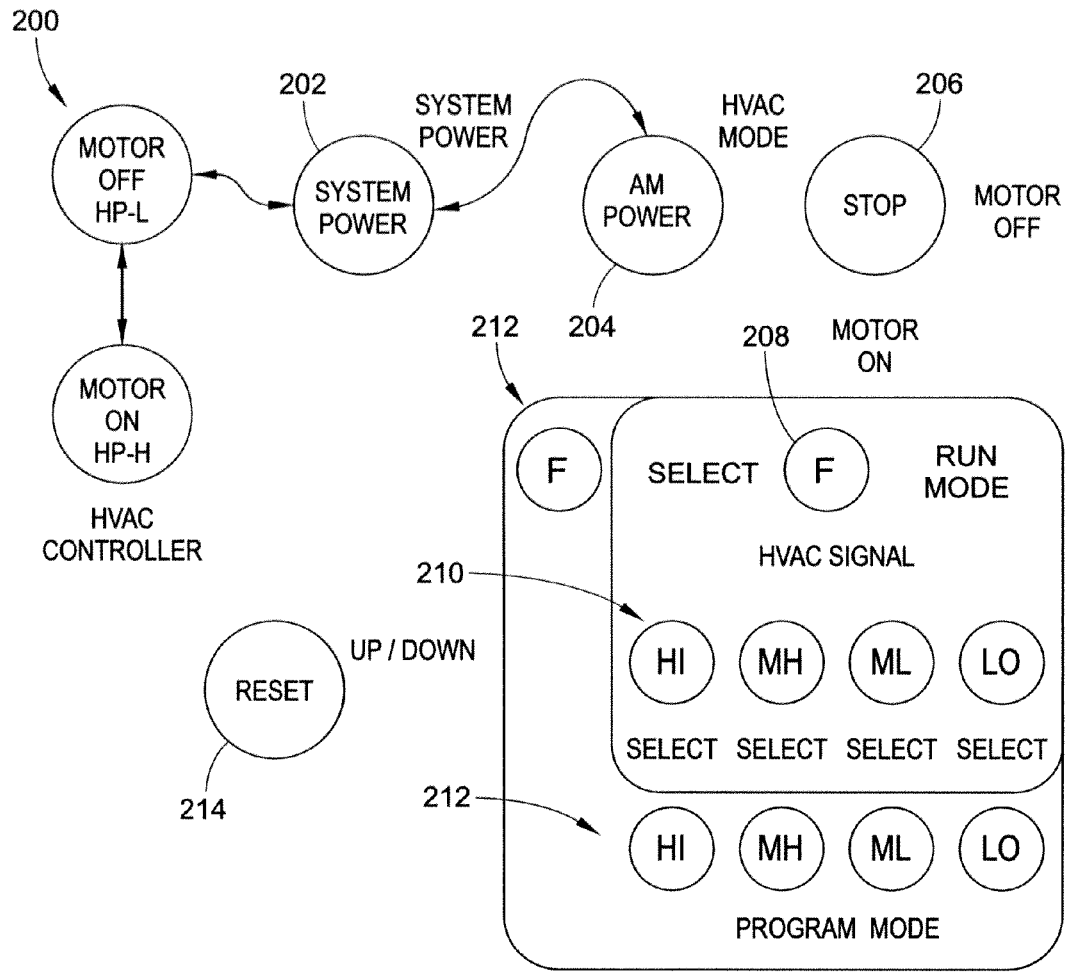
FIG. 2 is a state diagram of an adjustment module.

With reference to FIG. 2, a state diagram 200 that may be employed by the adjustment module 106 is provided. The state diagram 200 includes a system off state 202, an adjustment module power state 204, a stop state 206, a run mode fan state 208, run mode (any speed) states 210, program mode states 212, a reset mode state 214, and the like.

The adjustment module 106 is suitably in the system off state 202 when there is no power to the HVAC system 100. This may be due to, for example, power loss or a technician servicing the system 100. In this state 202, the adjustment module 106 does nothing because there is no power. To exit this state 202, power must generally be supplied.

The adjustment module 106 enters the adjustment module power state 204 when it was previously in the system off state 202 and the HVAC system 100 has been powered up. In certain embodiments, the adjustment module 106 receives 24V when the HVAC system 100 is powered up. In the adjustment module power state 204, the adjustment module 106 may startup and/or initializes itself. This may include, for example, reading and/or displaying an operating mode. To exit this state 204, any startup and/or initialization tasks must generally be completed.

The adjustment module 106 enters the stop state 206 when it was previously in the adjustment power state 204 and the system 100 does not require blower operation. In this state 206, the adjustment module 106 suitably waits for control commands and/or a motor power signal. The adjustment module 106 suitably exits this state 206 upon receipt of a motor power signal. In certain embodiments, the motor power signal may be the motor ready signal, discussed above.

The adjustment module 106 enters the run mode fan state 208 when the adjustment module 106 was previously in the stop state 206 and the integrated motor 102 is starting blower operation and/or the adjustment module 106 receives control commands to run in a constant fan operating mode. In this state 208, the integrated motor 102 is suitably run at a constant speed, torque, airflow, or static pressure in accordance with a fan operating mode. The adjustment module 106 suitably exits this state 208 upon loss of motor power, selection of a programming mode (e.g., depression of the select button, discussed above), selection of an operating mode other than fan mode, or the like.

The adjustment module 106 enters the run mode (any speed) states 210 if the adjustment module 106 was previously in the run mode fan state 208 and a request for a different operating mode is made. For example, a request is made for a heating operating mode. In these states 210, the adjustment module 106 suitably controls the integrated motor 102 in accordance with the operating setting associated with the operating mode. The adjustment module 106 suitably exits these states 210 upon loss of motor power, selection of a programming mode, selection of an operating mode other than the present operating mode, or the like.

The adjustment module 106 enters program mode states 212 if the adjustment module 106 was previously in the run mode fan state 208 or the run mode (any speed) states 210 and a technician is adjusting blower speed for the present operating mode. A technician may adjust the blower speed by, for example, pressing a select button while in a run mode. In these states 212, the technician may adjust the operating setting associated with the current run mode. To exit these states 212, the technician takes appropriate action exit these states 212. For example, the technician may select a button.

The adjustment module 106 enters the reset state 214 if, for example, a reset button is depressed while in a program mode. Suitably, this operating mode restores factory default settings to the adjustment module 106. When the restoration is complete, the adjustment module 106 may return to program mode.

Figure 3:
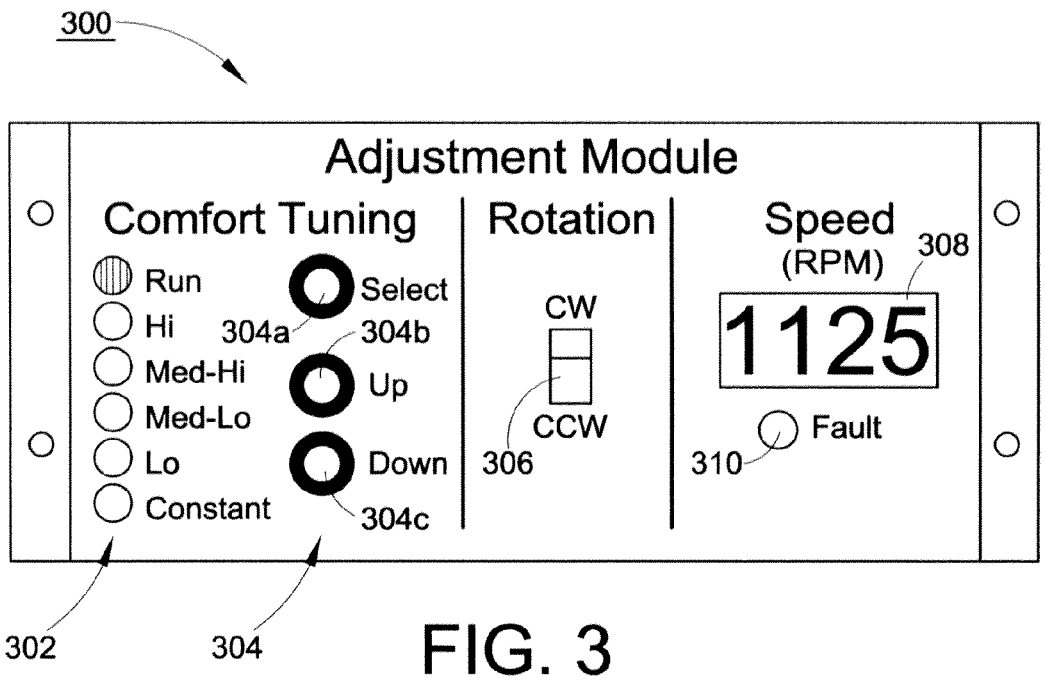
FIG. 3 is an adjustment module according to aspects of the exemplary embodiment.

With reference to FIG. 3, an adjustment module 300 according to aspects of the exemplary embodiment is provided. The adjustment module 300 is a more specific embodiment of the adjustment module 106 of FIG. 1. Therefore, the discussion heretofore is equally amenable to the discussion to follow and components described hereafter are to be understood as paralleling like components discussed heretofore, unless noted otherwise.

The adjustment module 300 suitably instructs an associated integrated motor as to a speed or torque to use, where these instructions are based on input from one or more command inputs, such as the command inputs 116 of FIG. 1. Each command input may correspond to a different speed, torque, airflow, or static pressure for the integrated motor (collectively referred to as the "operating settings"). Airflow and static pressure are suitably translated to speed or torque in accordance with the discussion of FIGS. 5-7.

When one of the command inputs is activated, the adjustment module 300 suitably instructs the integrated motor to run at the associated operating setting. Activation may be accomplished by providing 24V, but other means are appropriate. The adjustment module 300 may further instruct he associated integrated motor as to operating direction.

The adjustment module 300 suitably allows adjustment of operating settings associated with the one or more command inputs. To facilitate such a modification, the adjustment module 300 may include one or more operating mode light sources 302, one or more tuning user input devices 304, a direction user input device 306, an operating setting display 308, a fault light source 310, and the like.

The operating mode light sources 302 suitably provide an indication as to which of the command inputs are activated. Further, each of the operating mode light sources 302 suitably corresponds to a different command input. Command inputs may include one or more of run, high, medium-high, medium low, low, constant, and the like. The operating mode light sources 302 may include one or more LEDs, fluorescent lights, halogen lights, and the like.

The tuning user input devices 304 suitably allow a user of the adjustment module 300 to change operating settings associated with the command inputs. Suitably, the tuning user input devices allow a user of the adjustment module 300 to increase and/or decrease the operating setting associated with the present activated command input. The tuning user input devices 304 may include one or more of buttons, switches, and the like.

In certain embodiments, the tuning user input devices 304 may include one or more of a select button 304a, an up button 304b, a down button 304c, and the like. In such embodiments, an installation and/or maintenance technician may select the select button 304a of the adjustment module 300 to enter an edit mode for the presently activated command input. Once in the edit mode, the installation and/or maintenance technician may then select the up button 304b and/or the down button 304c to increase and/or decrease the operating setting in predetermined increments, such as increments of 10 RPM or 1 oz-ft. When the adjustments are complete, the installation and/or maintenance technician may then press the select button 304a again to exit the edit mode.

The direction user input device 306 suitably allows a user of the adjustment module 300 to change the operating direction of the associated integrated motor. Namely, the direction user input device 306 suitably allows a user of the adjustment module 300 to specify whether the associated integrated motor runs in a clockwise or counter clockwise direction. The direction user input device 306 may include a switch, one or more buttons, and the like. Adjusting the direction of the motor rotation to operate in the correct direction is required for proper operation of the blower.

Figure 4:
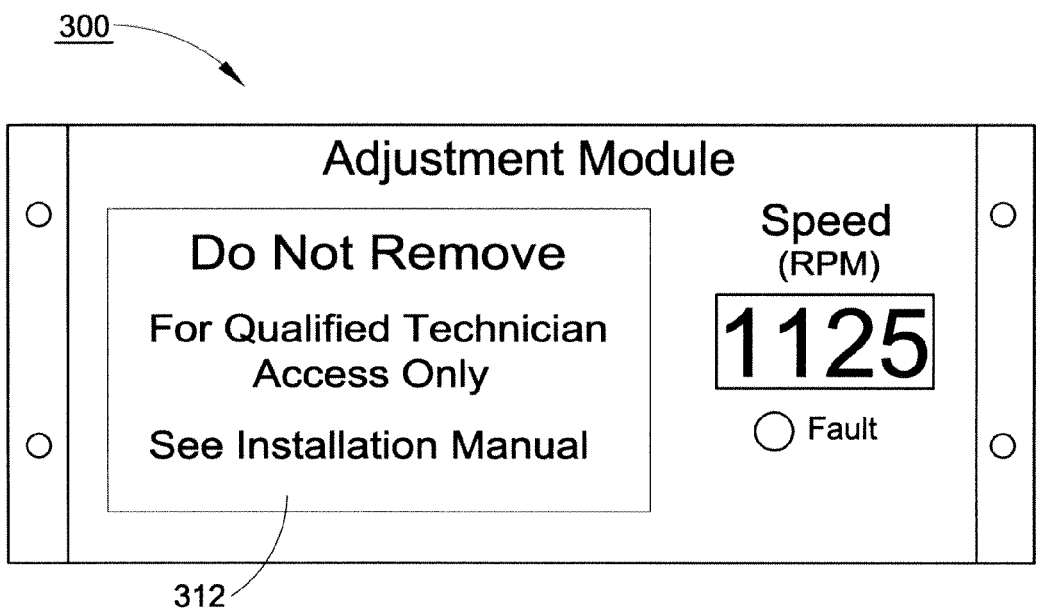
FIG. 4 is the adjustment module FIG. 3 with a protective cover.

In certain embodiments, one or more of the operating mode light sources 302, the tuning user input devices 304, the direction user input device 306, and the like may be protected from tampering by a home user of the adjustment module 300 as shown in FIG. 4. Namely, the adjustment module 300 module may include a protective cover 312 as shown in FIG. 4.

Referring back to FIG. 3, the operating setting display 308 suitably displays a speed, torque, airflow, or static pressure of the associated integrated motor as reported to the adjustment module 300. In certain embodiments, the adjustment module 300 may receive a speed signal or a torque signal from the associated integrated motor specifying the current speed or current torque of the integrated motor. Where the operating setting is airflow or static pressure, the torque or speed specified by the torque signal or speed signal may be translated to airflow or static pressure as described in connection with FIGS. 5-7.

The operating setting display 308 may display a graphical representation of the calculated airflow or static pressure, the speed signal, or the torque signal using, for example, numerical characters. The operating setting display 308 suitably includes an LCD display, but other displays are equally amenable. For example, the operating setting display 308 may include a CRT display, a projection based display, an LED display, and the like.

The fault light source 310 suitably indicates when a fault is occurs with the associated integrated motor. In certain embodiments, the adjustment module 300 may receive a fault signal from the integrated motor and control the fault light source 310 on the basis of this signal. The fault light sources 310 may include one or more LEDs, fluorescent lights, halogen lights, and the like.

Alternatively, all of the display items (302, 306 and 308) may be combined into a single graphical or numeric display, such as an LCD display, an Organic LED display, or a Vacuum Fluorescent display.

In certain embodiments the system can be configured to enable programming of the ECM motor to cause the blower to produce a particular air flow rate of cubic feet per minute (CFM). This can be accomplished by measuring the CFM directly with appropriate instruments (e.g., flow meters, etc.) at a particular speed (rpm) of the motor and causing the speed and CFM to be recorded in the control memory. This operation will establish the correct relation of rpm per CFM, which can be used to calculate the required speed that will produce any value of CFM within the operating range of the blower. Alternatively, the CFM can be calculated using blower wheel dimensional constants and static pressure at a particular blower motor speed.

According to additional aspects of the exemplary embodiment, methods to solve for CFM from known speeds and torque, to solve for SP from known speeds and torque, to solve for the torque needed to get a specific CFM, and to solve for the torque needed to get a specific SP are provided. Briefly, the methods require knowledge of the polynomial equations that describe the CFM and/or the SP of the motor in terms of the motor torque at a "Base Speed" (normally 1000 rpm) and the Affinity Laws for Fans. Further, it is assumed that the motor speed can be accurately measured and/or the torque can be accurately determined, usually by operating the motor in a "constant-torque" mode.

Before discussing the methods in detail, it is to be understood that the following variables are defined as follows.

$N_b$=the base speed used in the calculations (this is 1000 rpm)
$T_b$=the base torque at 1000 rpm and a specific CFM or SP
$CFM_b$=the base CFM at 1000 rpm and a specific $T_b$ or SP
$SP_b$=the base SP at 1000 rpm and a specific $T_b$ or CFM
$N_x$=the blower wheel speed in rpm at the operating speed
$T_x$=the blower motor torque at the operating speed
$CFM_x$=the output CFM of the blower at the operating speed
$SP_x$=the blower static pressure at the operating speed
$R$=ratio of operating speed to the base speed
$T_p$=Programmed torque in OzFt
$N_m$=Measured speed at programmed torque $T_p$ The method to solve for CFM from known speeds and torque includes modeling motor CFM as a function of motor torque. Suitably, CFM as a function of torque is modeled using a third-order polynomial as follows:

$$CFM_b = A_1(T_b)^3 + B_1(T_b)^2 + C_1(T_b) + D_1, \qquad (1)$$

where $A_1$, $B_1$, $C_1$, and $D_1$ are coefficients unique to the fan or blower wheel. However, higher and/or lower order polynomials are contemplated. Regardless of the order of the polynomial employed, modeling entails determining the coefficients $A_1$, $B_1$, $C_1$, $D_1$.

Figure 5:
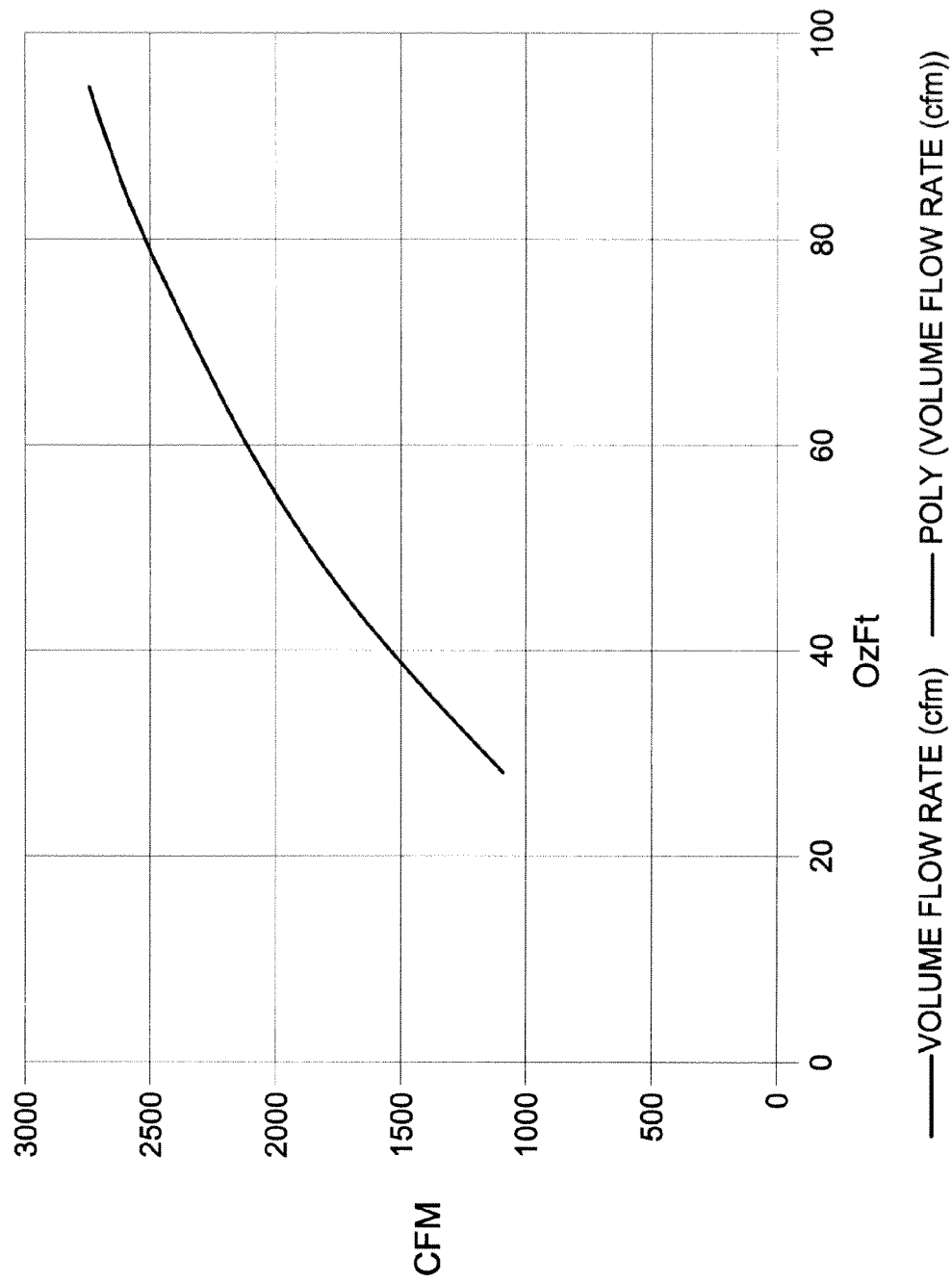
FIG. 5 is a graph of a corpus of data points representing the relation between cubic feet per minute (CFM) and torque at a speed of 1000 RPM.

To solve for the coefficients, a polynomial trend line of the desired order is fit to a corpus of data points representing the relation between CFM and torque. Suitably, these data points are empirically determined through testing. With reference to FIG. 5, a corpus of data points representing the relation between CFM and torque is illustrated. Further illustrated in FIG. 5 is third order polynomial trend line fitted to the data points. Notably, the coefficients for the trend line are $A_1$=1.891E−03, $B_1$=−5.551E−01, $C_1$=6.958E+01 and $D_1$=−4.572E+02.

The method further includes solving for the ratio R of the operating speed to the base speed:

$$R = N_x/N_b \; (N_b \text{ is always 1000 rpm}). \qquad (2)$$

Then, solving for the base torque at 1000 rpm by dividing the operating torque by R squared:

$$T_b = T_x/(R)^2. \qquad (3)$$

Next, solving for the base CFM using equation (1) and the value of $T_b$ as determined by (3) above. The CFM at the operating speed is determined by multiplying the $CFM_b$ by the ratio R:

$$CFM_x = CFM_b(R). \qquad (4)$$

The method to solve for the torque needed to get a specific CFM includes modeling motor CFM as a function of motor torque as provided above. The method further includes solving for $CFM_b$ using equation (1). This requires solving equation (3) for $T_b$ using the programmed torque $T_p$, measured motor speed $N_m$, and $N_b$ base speed of 1000 RPM.

$$T_b = T_p/(N_m/N_b)^2. \qquad (5)$$

Also, by manipulating equation (3), the needed torque $T_x$ can be calculated as follows:

$$T_x = T_b(R)^2. \qquad (6)$$

Using the fan laws, R can be determined as shown below:

$$R = CFM_x/CFM_b. \qquad (7)$$

Solving for $T_x$ using, (5) and (7) yields the desired torque:

$$T_x = T_b(CFM_x/CFM_b)^2. \qquad (8)$$

Figure 6:
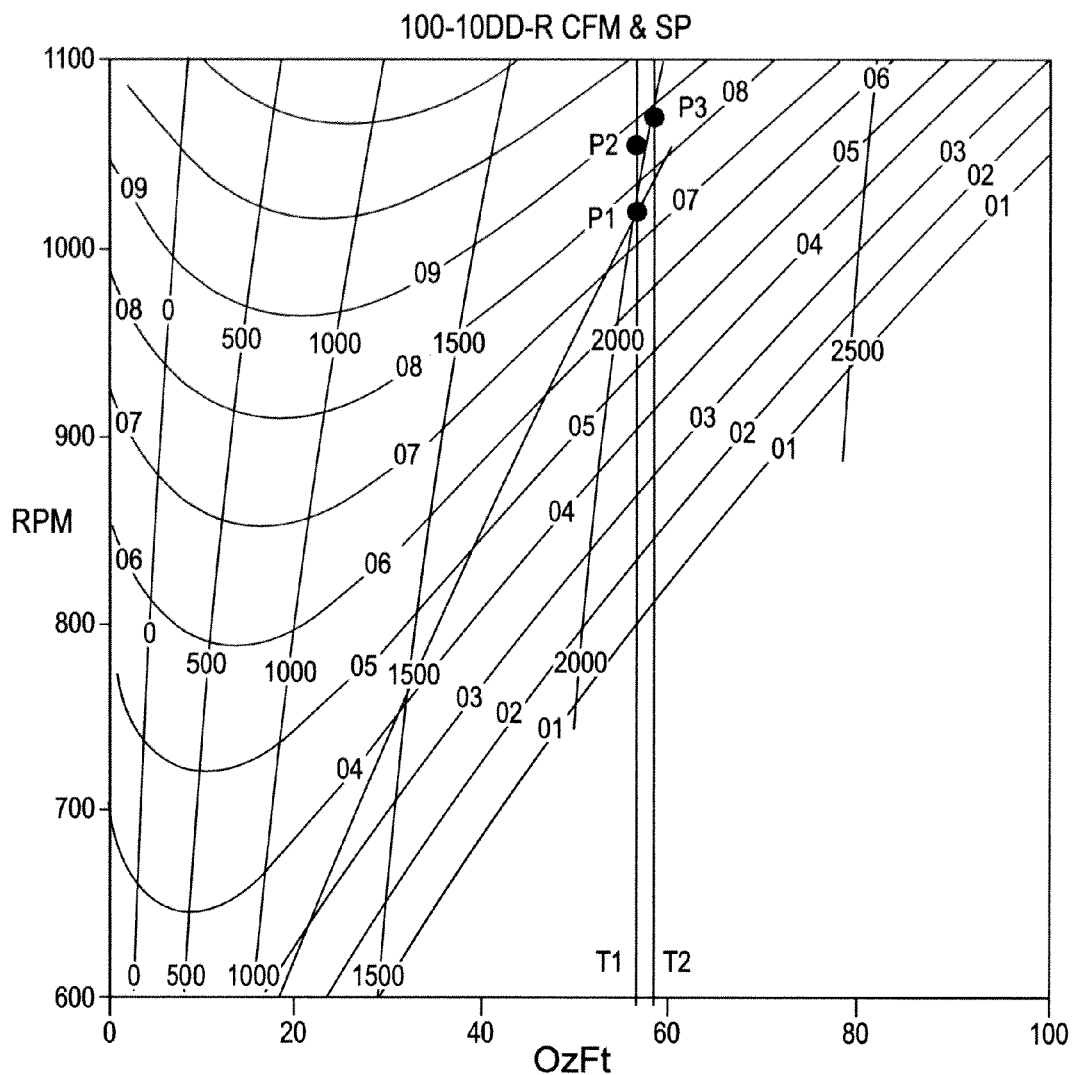
FIG. 6 is a physical explanation of a method to solve for the torque needed to get a specific CFM; and, FIG. 7 is a graph of a corpus of data points representing the relation between static pressure (SP) and torque at a speed of 1000 RPM.

With reference to FIG. 6, a physical explanation of this method is provided. The figure illustrates contours of constant CFM and SP for a 10×10 blower wheel. If one assumes that this wheel requires ¾ HP at 1050 RPM in a given system, then a system load line can be drawn as indicated by the blue line. Now assume the system is configured to operate at 2000 CFM. The operating point (P1) is the intersection of the 2000 CFM contour line and the system load line. The motor is operating in constant torque mode outputting torque (T1).

Imagine that something in the system increases the resistance to airflow and therefore increases SP. This represents a change in system load represented by the short blue line. Since the motor is operating in constant torque mode the system operating point changes to P2. One can see that the flow is slightly different than 2000 CFM. Using the method described above one can determine the new operating point (P3) and torque required (T2) to produce 2000 CFM.

The method to solve for SP from known speeds and torque includes modeling SP as a function of motor torque. Suitably, SP as a function of torque is modeled using a third-order polynomial as follows:

$$SP_b = A_2(T_b)^3 + B_2(T_b)^2 + C_2(T_b) + D_2, \qquad (9)$$

where $A_2$, $B_2$, $C_2$, and $D_2$ are coefficients unique to the motor. However, higher and/or lower order polynomials are contemplated. Regardless of the order of the polynomial employed, modeling entails determining the coefficients $A_2$, $B_2$, $C_2$, $D_2$.

To solve for the coefficients, a polynomial trend line of the desired order is fit to a corpus of data points representing the relation between SP and torque. Suitably, these data points are empirically determined through testing. With reference to FIG. 7, a corpus of data points representing the relation between SP and torque is illustrated. Further illustrated in FIG. 7 is third order polynomial trend line fitted to the data points. Notably, the coefficients for the trend line are $A_2$=1.362E−06, $B_2$=−3.675E−04, $C_2$=1.410E−02 and $D_2$=8.228E−01.

The method further includes solving for the ratio R of the operating speed to the base speed:

$$R = N_x/N_b \; (N_b \text{ is always 1000 rpm}). \qquad (10)$$

Then, solving for the base torque at 1000 rpm by dividing the operating torque by R squared:

$$T_b = T_x/(R)^2. \qquad (11)$$

Next, solving for the base SP using equation (9) and the value of $T_b$ as determined by (11) above. The SP at the operating speed is determined by multiplying the $SP_b$ by the ratio $R^2$:

$$SP_x = SP_b(R)^2. \quad (12)$$

The method to solve for the torque needed to get a specific SP includes modeling SP as a function of motor torque as provided above. The method further includes solving for $SP_b$ using equation (9). This requires solving equation (11) for $T_b$ using the programmed torque $T_p$, measured motor speed $N_m$, and $N_b$ base speed of 1000 RPM.

$$T_b = T_p/(N_m/N_b)^2. \quad (13)$$

Also, by manipulating equation (11), the needed torque $T_x$ can be calculated as follows:

$$T_x = T_b(R)^2. \quad (14)$$

Using the fan laws to determine $R^2$, $R^2$ can be determined as shown below:

$$R^2 = SP_x/SP_b \quad (15)$$

Solving for $T_x$ using (9), (13) and (15) yields the desired torque:

$$T_x = T_b(SP_x/SP_b) \quad (16)$$

Heat Output Leveling Means for Existing Installed Gas Furnaces and Heaters

In another embodiment, a novel concept to automatically vary and control the heat output of a single stage burner in existing furnaces, particularly in unitary HVAC heating systems, is described below.

All older and over 90% of the new residential hot air furnaces have a burner that turns fully on when the thermostat calls for heat. This is accomplished by opening the solenoid operated valve in the gas supply line. The heated air is then circulated throughout the house by a single speed centrifugal blower. When room temperature reaches the thermostat setting the thermostat closes the valve thus turning the burner off. When the room cools off, the cycle repeats.

The result is that the system produces sudden cool drafts when the air is first turned on, the motor running at full speed is noisy and the temperature is constantly rising or falling.

These undesirable effects can all be cured by installing a modulating or multi-stage valve in the fuel supply line ahead of the main on-off valve and a variable speed blower motor. This system can be controlled to run at the rate needed to maintain an even room temperature by use of a timer which provides a gradual increase in heat and air flow until the desired temperature is reached and then holding at that point.

Alternatively, heat and related speed can be controlled by magnitude of temperature vs. thermostat setting differential, indoor-outdoor temperature differential, humidity, etc.

The benefits of this variable heat & air flow system include, but are not limited to the following:

No cold drafts
Constant room temperature
Reduced motor and blower noise
Much less electric power to operate the motor at lower speeds
Better air filtering with slower air flow
Correcting room to room temperature differences through constant circulation
Elimination of temperature layering in each room An alternate means is to turn the primary valve on and off at a rate that is proportionate to the thermal capacity of the heat exchanger so that fluctuations in output air temperature is minimized.

The disclosure has been made with reference to preferred embodiments. Obviously, modifications and alterations will occur to others upon reading and understanding the preceding detailed description. It is intended that the preferred embodiments be construed as including all such modifications and alterations insofar as they come within the scope of the appended claims or the equivalents thereof.

The invention claimed is:

1. A variable speed blower motor unit controlled by a heating, ventilation and air conditioning (HVAC) system controller, said variable speed blower comprising:
   an integrated motor including a plurality of operating speeds or torques, an input for selecting one of the plurality of operating speeds or torques, a variable speed motor and a motor driver driving the variable speed motor; and,
   an adjustment module coupled to the integrated motor and the HVAC system controller, wherein said adjustment module includes a plurality of operating modes each associated with one of the plurality of operating speeds or torques;
   wherein said adjustment module is configured to:
     select one of the plurality of operating modes on the basis of control commands received from the HVAC system controller;
     control the integrated motor according to the operating speed or torque associated with the selected operating mode; and
     vary the associations of a plurality of the plurality of operating modes;
   wherein the HVAC system controller includes a plurality of tap connectors corresponding to the plurality of operating modes, each tap connector engaged when said adjustment module is in the corresponding operating mode, wherein the tap connectors are at least one of: 1) used to provide control commands to the adjustment module; and 2) ORed together to power the integrated motor.

2. The variable speed blower of claim 1, wherein the control commands are received from a thermostat of the HVAC system controller.

3. The variable speed blower of claim 1, wherein the adjustment module gradually changes the integrated motor from a first speed or torque to a second speed or torque according to a predetermined rate.

4. The variable speed blower of claim 1, wherein the adjustment module includes a user input device to enable a constant blower operating mode.

5. The variable speed blower of claim 1, wherein the adjustment module includes a user input device to control a direction of rotation of the integrated motor.

6. The variable speed blower of claim 1, wherein the adjustment module includes a display of motor speed setting for an operating speed or torque.

7. The variable speed blower of claim 1, wherein the adjustment module includes a display of actual motor speed for an operating speed or torque.

8. The variable speed blower of claim 1, wherein each of the plurality of operating modes is associated with an airflow or static pressure, and wherein the adjustment module is further configured to:
   calculate the operating speed or torque of the selected operating mode from the corresponding air flow or static pressure; and
   control the integrated motor according to the calculated operating speed or torque associated with the selected operating mode.

9. The variable speed blower of claim 1, wherein said adjustment module is further configured to:
vary the association of the plurality of the plurality of operating modes to change factory default associations.

10. A heating, ventilation and air conditioning (HVAC) system, said system comprising:
an integrated motor including a plurality of operating speeds or torques and an input for selecting one of the plurality of operating speeds or torques;
a system controller; and,
an adjustment module including a plurality of operating modes each associated with one of the plurality of operating speeds or torques and each associated with an airflow or static pressure, wherein the adjustment module is configured to:
the associations of a plurality of the plurality of operating modes;
select one of the plurality of operating modes on the basis of control commands received from the system controller;
calculate the operating speed or torque of the selected operating mode from the corresponding air flow or static pressure; and
control the integrated motor according to the calculated operating speed or torque associated with the selected operating mode.

11. The HVAC system of claim 10, wherein the control commands are received from a thermostat of the system controller.

12. The HVAC system of claim 10, wherein the integrated motor is powered by ORing tap connectors of the system controller.

13. The HVAC system of claim 10, wherein the adjustment module gradually changes the integrated motor from a first speed or torque to a second speed or torque according to a predetermined rate.

14. The HVAC system of claim 10, wherein the integrated motor includes a variable speed motor and a motor driver.

15. The HVAC system of claim 10, wherein the adjustment module includes a user input device to enable a constant blower operating mode.

16. The HVAC system of claim 10, wherein the adjustment module includes a user input device to control a direction of rotation of the integrated motor.

17. The HVAC system of claim 10, wherein the adjustment module includes a display of motor speed setting for an operating speed or torque.

18. The HVAC system of claim 10, wherein the adjustment module includes a display of one or more of actual motor speed for an operating speed, CFM, SP, motor power consumption, temperature, temperature rise, temperature drop, change in humidity, cooling or heating energy (Btu), and system efficiency.

19. The HVAC system of claim 10, wherein the system controller includes a plurality of tap connectors corresponding to the plurality of operating modes, each tap connector engaged when said adjustment module is in the corresponding operating mode, wherein the tap connectors are at least one of: 1) used to provide control commands to the adjustment module; and 2) ORed together to power the integrated motor.

20. The HVAC system of claim 19, wherein the integrated motor includes a variable speed motor and a motor driver driving the variable speed motor.

* * * * *